United States Patent
Ichikawa et al.

(10) Patent No.: US 7,646,222 B2
(45) Date of Patent: Jan. 12, 2010

(54) SEMICONDUCTOR DEVICE FOR GENERATING POWER ON RESET SIGNAL

(75) Inventors: Masaki Ichikawa, Fujisawa (JP); Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 11/376,416

(22) Filed: Mar. 16, 2006

(65) Prior Publication Data
US 2006/0208777 A1   Sep. 21, 2006

(30) Foreign Application Priority Data
Mar. 17, 2005   (JP) ............................ 2005-077802

(51) Int. Cl.
*H03L 7/00* (2006.01)
(52) U.S. Cl. ...................... 327/143; 327/142
(58) Field of Classification Search .................. 327/143, 327/142, 198
See application file for complete search history.

(56) References Cited

U.S. PATENT DOCUMENTS

| | | | |
|---|---|---|---|
| 5,214,316 A | 5/1993 | Nagai | 365/227 |
| 6,340,906 B1 * | 1/2002 | Mizutani | 327/198 |
| 6,418,075 B2 | 7/2002 | Shimano et al. | 327/143 |
| 6,492,863 B2 * | 12/2002 | Kono et al. | 327/538 |
| 6,873,193 B2 * | 3/2005 | Kinoshita et al. | 327/143 |
| 6,885,235 B2 * | 4/2005 | Tomishima et al. | 327/538 |
| 2005/0035796 A1 * | 2/2005 | Chun et al. | 327/143 |
| 2005/0140405 A1 * | 6/2005 | Do et al. | 327/143 |
| 2007/0255984 A1 * | 11/2007 | Yee | 714/724 |

FOREIGN PATENT DOCUMENTS

JP   11-344533   12/1999

* cited by examiner

*Primary Examiner*—Lincoln Donovan
*Assistant Examiner*—Diana J Cheng
(74) *Attorney, Agent, or Firm*—Oblon, Spivak, McClelland, Maier & Neustadt, L.L.P.

(57) ABSTRACT

A reference voltage generating circuit receives a power supply voltage and generates a reference voltage. A reference voltage level guarantee circuit generates a sense signal when the circuit senses that a value of the reference voltage has reached a predetermined value. A power supply voltage sensing circuit has a voltage comparator circuit which compares a voltage obtained by dividing a power supply voltage with the reference voltage and outputs a power ON reset signal. An operation of the voltage comparator circuit is controlled based on a sense signal. When the value of the power supply voltage increases and the value of the reference voltage reaches a predetermined value, the voltage comparator circuit operates, and a power ON reset signal is outputted in response to a result of comparison between a divisional voltage and the reference voltage.

11 Claims, 9 Drawing Sheets

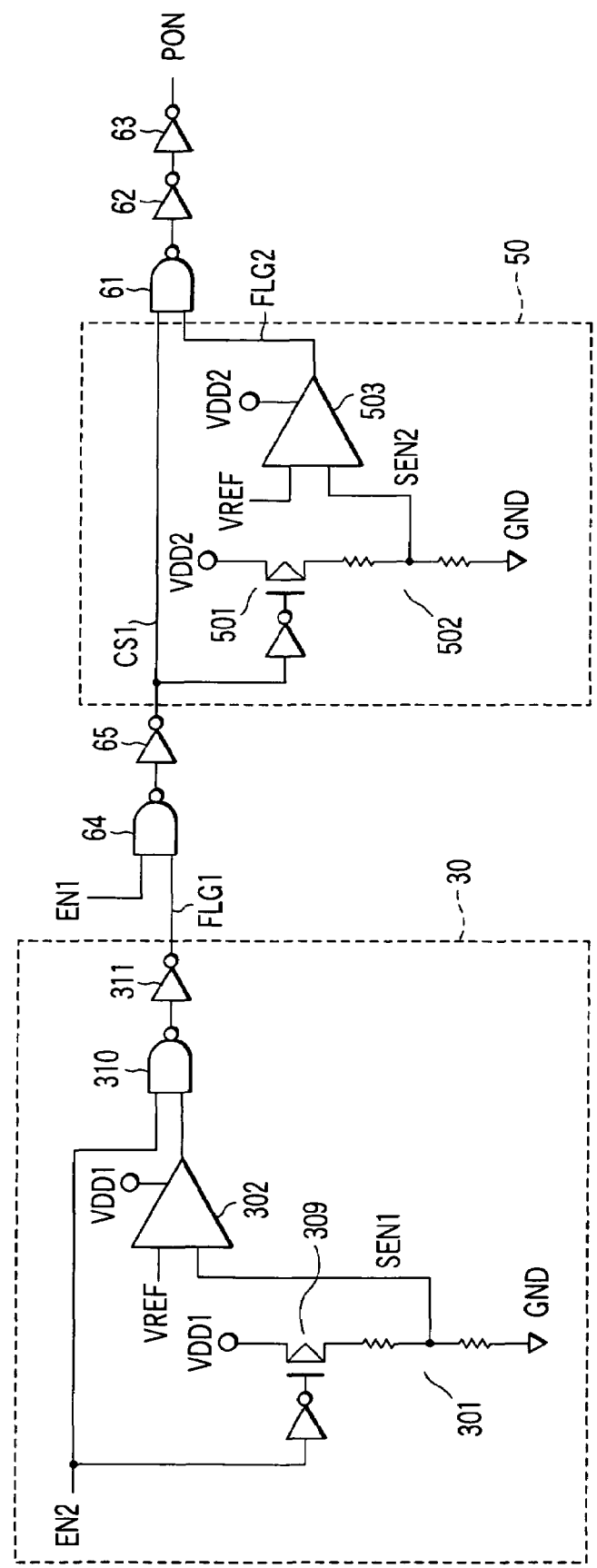
F I G. 12

SEMICONDUCTOR DEVICE FOR GENERATING POWER ON RESET SIGNAL

CROSS-REFERENCE TO RELATED APPLICATIONS

This application is based upon and claims the benefit of priority from prior Japanese Patent Application No. 2005-077802, filed Mar. 17, 2005, the entire contents of which are incorporated herein by reference.

BACKGROUND OF THE INVENTION

1. Field of the Invention

The present invention relates to a semiconductor device having incorporated therein a circuit for outputting a power ON reset signal.

2. Description of the Related Art

At the time of turning ON the power of a semiconductor device, in order to avoid malfunction, it is necessary to sense that a value of a power supply voltage enters an operating range, and then, make an initializing operation based on a sense signal. A sense voltage for sensing a power supply voltage always needs to be set so as to be equal to or smaller than an operating guarantee voltage and must be at a value for all circuits to normally operate. Sensing a power supply voltage includes: a method utilizing a threshold voltage of a transistor or a method utilizing a charging and a discharging of a capicitance. However, with either of these methods, it is unavoidable that the sense voltage is distorted depending on process distortion or temperature characteristics.

In the case where a rise of the power supply voltage is extremely slow, the initializing operation is made under the sense voltage. Alternatively, in the case where the distortion of the sense voltage is large, there is a danger that the voltage is lower than a lower limit in an operating range of a circuit requiring the initializing operation, and it is desired that a precise voltage should be sensed.

In particular, in the case of a semiconductor device having multiple power sources, an operation is started after sensing that all the power sources have been turned ON. However, all the power sources are not always turned ON at the same time, and thus, there occurs a case in which the initializing operation is performed while one power source is at a maximum operating voltage and another power source is equal to or smaller than an operating guarantee voltage. In the case where a circuit targeted for initialization uses a plurality of power sources, the circuit is required to operate in a wider voltage range by a distortion of a power sensing circuit than a normal operating voltage, making a circuit design difficult in particular.

In order to precisely sense a power supply voltage, it is preferable that the power supply voltage should be compared with a reference voltage generated from a Band Gap Reference (BGR) circuit or the like. However, when a value of the power supply voltage is low, a level of the reference voltage itself cannot be guaranteed, thus making it necessary to take countermeasures such as increasing a power supply voltage of a reference voltage generating circuit. Therefore, there is a problem that a circuit becomes complicated and large-scaled.

In Jpn. Pat. Appln. KOKAI Publication No. 11-344533, there is disclosed a semiconductor test device comprising sequence control means for, in power units of the semiconductor test device for sequentially making sequence control of rises of a plurality of unit power sources in order of first, second, and third unit power sources, when the first unit power source should supply a direct current voltage to a load unit earlier than the second unit power source, detecting that the direct current voltage outputted by the first unit power source has reached a predetermined value or the like, and outputting a direct current voltage of the second unit power source.

BRIEF SUMMARY OF THE INVENTION

According to one aspect of the present invention, there is provided a semiconductor device which generates a power ON reset signal, comprising: a reference voltage generating circuit which receives a power supply voltage and generates a reference voltage whose value is smaller than that of the power supply voltage; a reference voltage level guarantee circuit which is connected to the reference voltage generating circuit, and which senses that a value of the reference voltage has reached a first predetermined value and generates a first sense signal; and a first power supply voltage sensing circuit which is connected to the reference voltage generating circuit and the reference voltage level guarantee circuit, and which includes a voltage comparator circuit for comparing a first voltage having a value that corresponds to the power supply voltage with the reference voltage, an operation of which is controlled based on the first sense signal, and outputs a power ON reset signal based on a comparison result of the voltage comparator circuit.

BRIEF DESCRIPTION OF THE SEVERAL VIEWS OF THE DRAWING

FIG. 12 is a circuit diagram specifically depicting a configuration of a power supply voltage sensing circuit and its peripheral circuits shown in FIG. 11.

DETAILED DESCRIPTION OF THE INVENTION

First Embodiment

Figure 1:
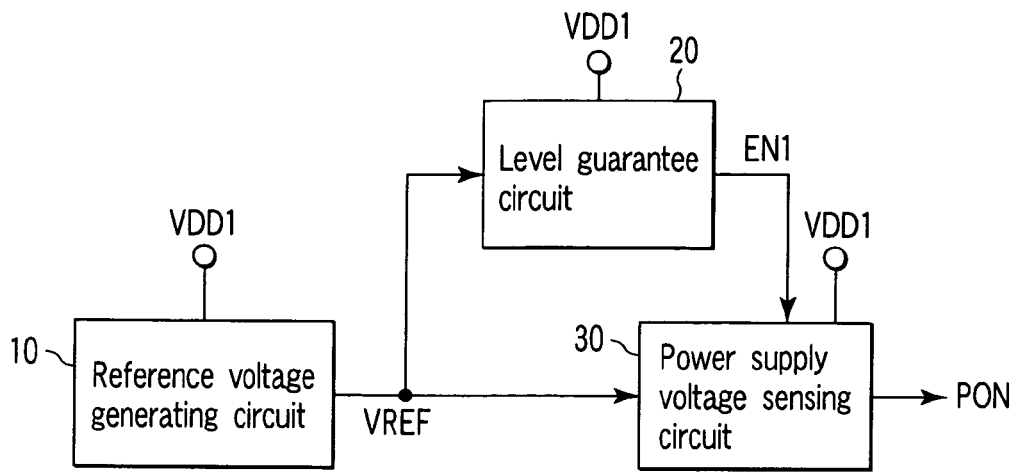
FIG. 1 is a block diagram depicting a semiconductor device according to a first embodiment.

FIG. 1 is a block diagram depicting a semiconductor device according to a first embodiment. The semiconductor device has: a reference voltage generating circuit 10; a reference voltage level guarantee circuit 20; and a power supply voltage sensing circuit 30.

The reference voltage generating circuit 10 receives a power supply voltage VDD1 and generates a reference voltage VREF whose value is smaller than VDD1. The reference voltage generating circuit 10 may be composed of a BGR circuit, for example. Otherwise, the voltage generating circuit 10 may be another type of reference voltage generating circuit 10 without being limited to the BGR circuit.

The reference voltage level guarantee circuit 20 senses that a value of the reference voltage VREF generated by the reference voltage generating circuit 10 has reached a predetermined value. A sense signal EN1 of the reference voltage level guarantee circuit 20 is supplied to the power supply voltage sensing circuit 30.

The power supply voltage sensing circuit 30 has a voltage comparator circuit whose operation is controlled based on the sense signal EN1. In addition, the sensing circuit compares a divisional voltage with the reference voltage VREF by means of a voltage comparator circuit, the divisional voltage having a value that is proportional to the power supply voltage VDD1, the power supply voltage VDD1 being divided at a predetermined divisional ratio, and carries out activation of a power ON reset signal PON based on a result of the comparison.

In a configuration as described above, after power has been turned ON, in the case where the power supply voltage VDD1 does not reach the predetermined value and the value of VDD1 is low, the reference voltage generating circuit 10 may not generate a reference voltage of a value to be essentially generated. The reference voltage level guarantee circuit 20 monitors a value of the reference voltage VREF and senses that the value of VREF has reached the predetermined value.

That is, in the semiconductor device according to the first embodiment, after the value of the reference voltage VREF has reached the predetermined value, a voltage having a value that corresponds to a power supply voltage is compared with the reference voltage VREF by means of a voltage comparator circuit included in the power supply voltage sensing circuit 30. As a result, the power supply voltage VDD1 is precisely sensed so that the power ON reset signal PON can be outputted.

Figure 2:
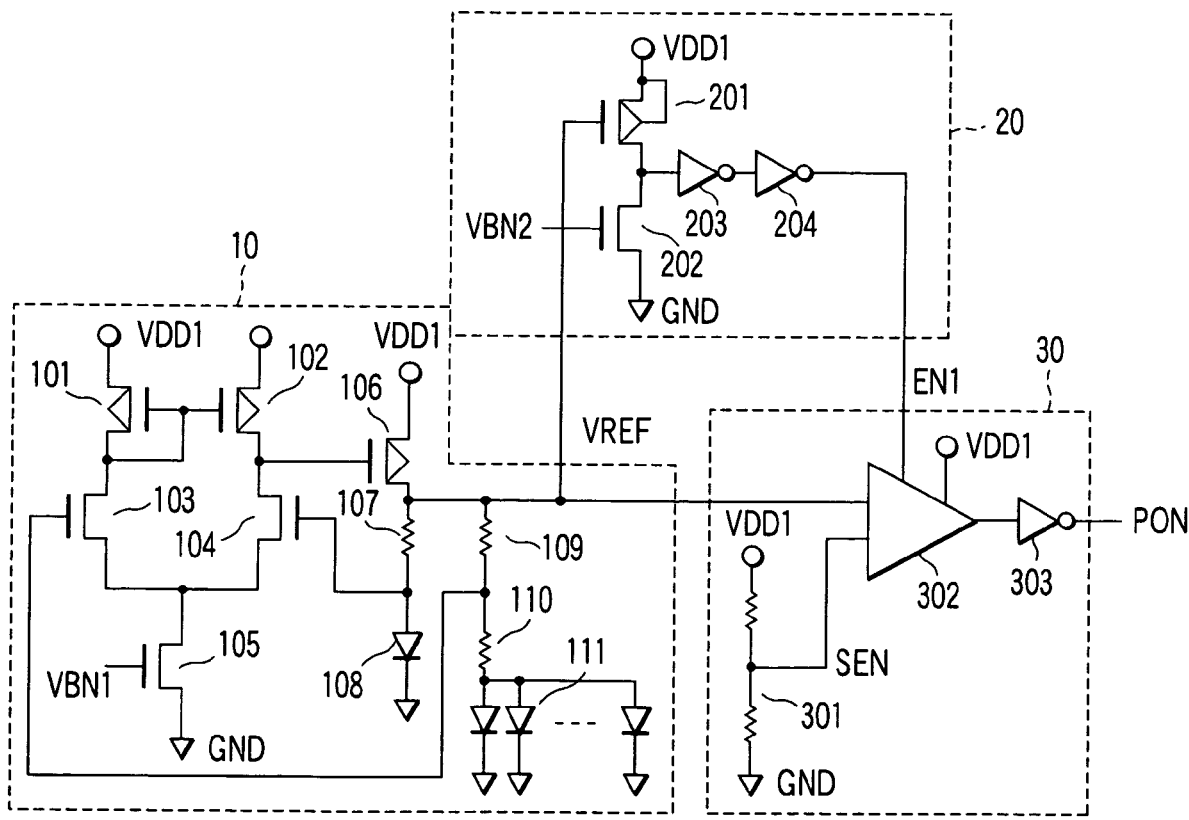
FIG. 2 is a circuit diagram specifically depicting a configuration of each section in the semiconductor device shown in FIG. 1.

FIG. 2 is a circuit diagram specifically depicting a configuration of each section in the semiconductor device shown in FIG. 1. In this case, the reference voltage generating circuit 10 is composed of a BGR circuit. This BGR circuit has a general, well known configuration. The BGR circuit has: a pair of PMOS transistors 101, 102, sources of which are connected to a supply node of the power supply voltage VDD1, each of which configures a current mirror load; a pair of driving NMOS transistors 103, 104, each of which is connected to the current mirror load; an NMOS transistor 105 for a current source, which is connected between a common drain of the NMOS transistors 103, 104 and a supply node of a ground voltage GND, a direct current bias voltage VBN1 being supplied to a gate; a PMOS transistor 106 connected in series between the supply node of the power supply voltage VDD1 and the supply node of the ground voltage GND; a serial connection node between a resistor element 107 and a forward direction diode 108 and between the PMOS transistor 106 and the resistor element 107, namely, a resistor element 109, one end of which is connected to an output node of the reference voltage VREF; a resistor element 110, one end of which is connected to the other end of the resistor element 109; and a plurality of diodes 111 connected in parallel so as to be in a forward direction, respectively, between the other end of the resistor element 110 and the supply node of the ground voltage GND.

In the thus configured BGR circuit, after power has been turned ON, a reference voltage VREF is outputted from a serial connection node between the PMOS transistor 106 and the resistor element 107.

The reference voltage level guarantee circuit 20 has: a PMOS transistor 201 and an NMOS transistor 202 whose source and drain are connected in series between the supply node of the power supply voltage VDD1 and the supply node of the ground voltage GND; an inverter circuit 203 whose input terminal is connected to a serial connection node of the both MOS transistors 201 and 202; and an inverter circuit 204 for inverting an output of the inverter circuit 203. The reference voltage VREF is supplied to a gate of the PMOS transistor 201, and a direct current bias voltage VBN2 is supplied to a gate of the NMOS transistor 202 so that a very small amount of current flows through the NMOS transistor 202.

In the thus configured reference voltage level guarantee circuit 20, after power has been turned ON, in the case where a value of the power supply voltage VDD1 is low and a value of the reference voltage VREF is lower than a predetermined value (VDD1-|Vthp|, Vthp is a threshold voltage of the PMOS transistor 202), the PMOS transistor 202 is turned OFF, and a sense signal EN1 outputted from the inverter circuit 204 enters an "L" level. Then, after the value of the power supply voltage VDD1 has risen and the value of the reference voltage VREF has reached a predetermined value, the PMOS transistor 201 is turned ON, and the sense signal EN1 is inverted into an "H" level. In this case, the predetermined value of the reference voltage VREF is set at a value which is lower by an absolute value |Vth| of a threshold voltage of the PMOS transistor 201 than the value of VDD1 when the power supply voltage enters a steady state.

The power supply voltage sensing circuit 30 has: a resistor dividing circuit 301 that includes of a pair of resistor elements, the circuit being connected in series between the supply node of the power supply voltage VDD1 and the supply node of the ground voltage GND to output a voltage SEN obtained by dividing the voltage VDD1 at a predetermined divisional ratio α1 (α1<1); a voltage comparator circuit 302 whose operation is controlled based on the sense signal EN1 outputted from the reference voltage level guarantee circuit 20, the circuit comparing the voltage SEN with the reference voltage VREF; and an inverter circuit 303 for inverting an output of the voltage comparator circuit 302. The power ON reset signal PON is outputted from the inverter circuit 303.

In the thus configured power supply voltage sensing circuit 30, the resistor dividing circuit 301 outputs a voltage proportional to the power supply voltage VDD1. When the sense signal EN1 of the reference voltage level guarantee circuit 20 enters an "H" level, the voltage comparator circuit 302 operates, and then, the voltage SEN and the reference voltage VREF are compared with each other by means of the voltage comparator circuit 302. Then, the power ON reset signal PON is activated and controlled based on a result of the comparison.

For example, assuming that a value of the power supply voltage VDD1 in a steady state is 2 V and a value of the reference voltage VREF is 1.2 V, a resistance ratio of a pair of resistor elements in the resistor dividing circuit 301 is set so that the divisional ratio α1 in the resistor dividing circuit 301 becomes 0.6.

Second Embodiment

Figure 3:
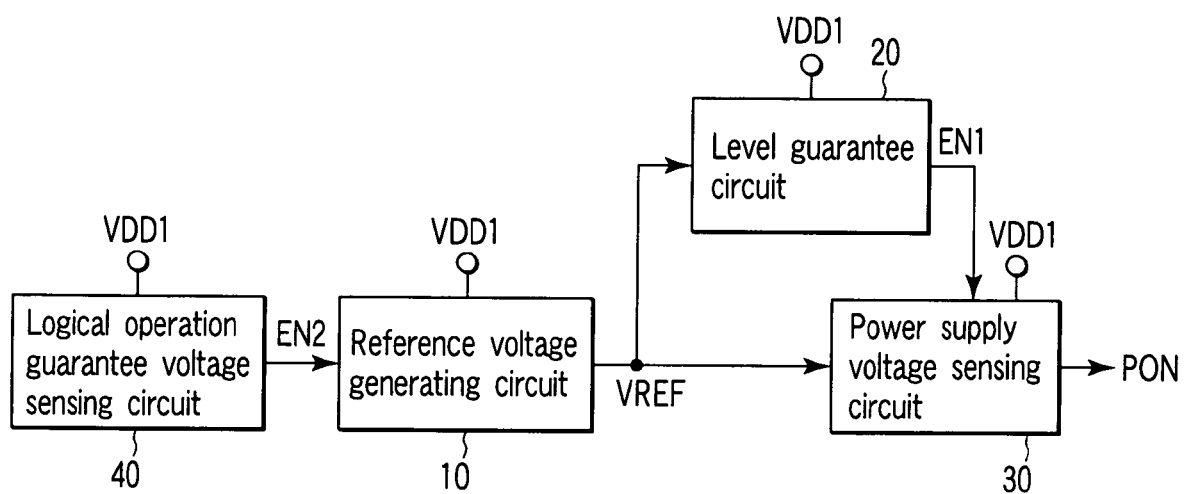
FIG. 3 is a block diagram depicting a semiconductor device according to a second embodiment.

FIG. 3 is a block diagram depicting a semiconductor device according to a second embodiment. In the semiconductor device according to the first embodiment, when power is turned ON, the reference voltage generating circuit 10 starts operation immediately. However, a value of the reference voltage VREF is not always obtained as a predetermined value at a time point at which a value of the power supply voltage VDD1 is low. Such a small value of the reference voltage VREF cannot be used as a reference voltage for comparison by the voltage comparator circuit 302 in the power supply voltage sensing circuit 30.

Therefore, the semiconductor device according to the second embodiment is different from the semiconductor device shown in FIG. 1 in that a logical operation guarantee voltage sensing circuit 40 is added. The logical operation guarantee voltage sensing circuit 40 detects that a power supply voltage VDD1 has reached a value at which a normal logical operation of a reference voltage generating circuit 10 or the like can be guaranteed. An output operation of a reference voltage VREF in the reference voltage generating circuit 10 is controlled based on the sense signal EN2.

In the semiconductor device according to the second embodiment, after a value of the power supply voltage VDD1 has reached the value at which a normal logical operation of the reference voltage generating circuit 10 can be guaranteed, the reference voltage VREF is outputted from the reference voltage generating circuit 10. Therefore, a power supply voltage sensing circuit 30 can sense the power supply voltage VDD1 more precisely and output a power ON reset signal PON.

Figure 4:
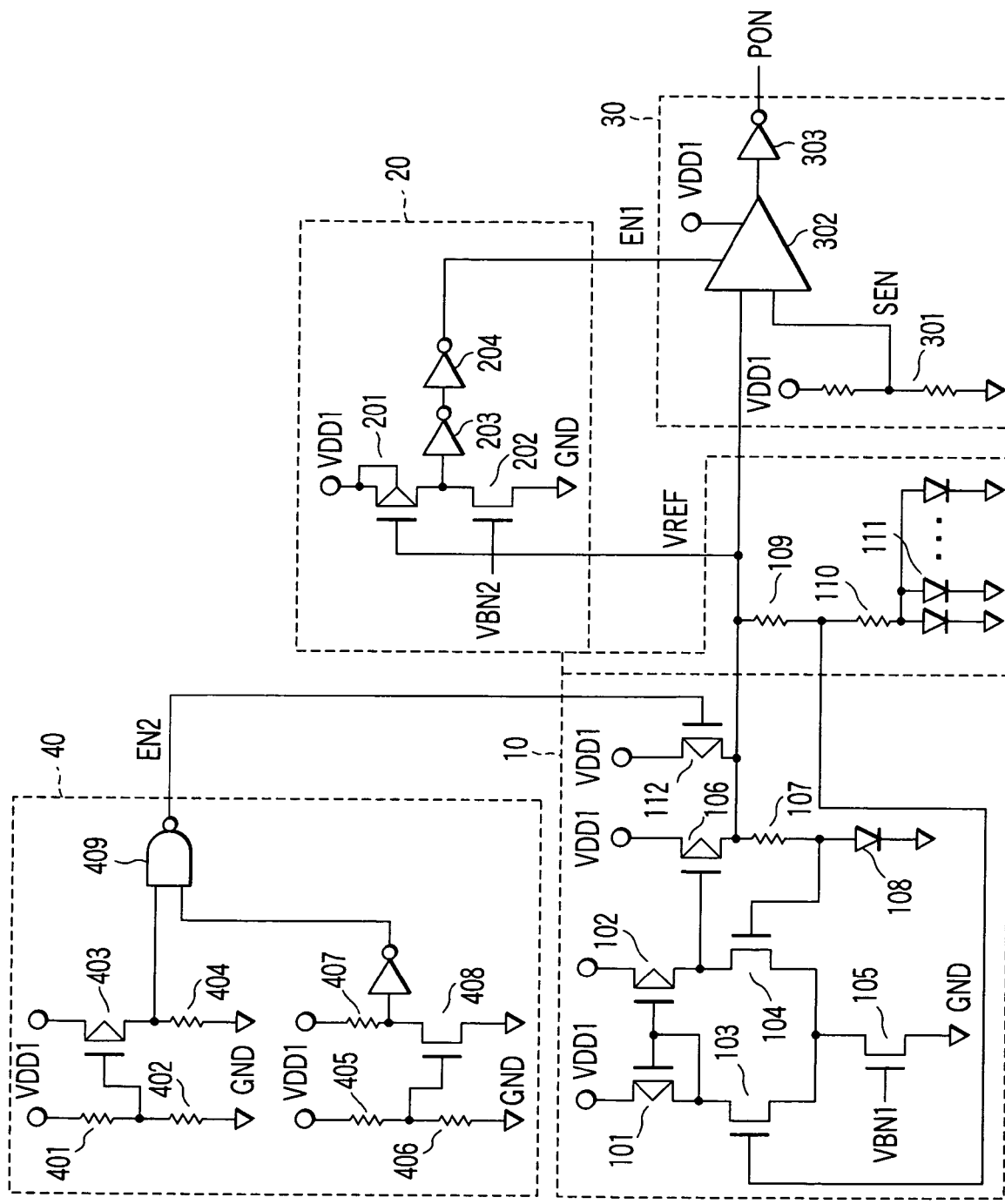
FIG. 4 is a circuit diagram specifically depicting a configuration of each section in the semiconductor device shown in FIG. 3.

FIG. 4 is a circuit diagram specifically depicting a configuration of each section in the semiconductor device shown in FIG. 3. In this case as well, the reference voltage generating circuit 10 is a BGR circuit. The reference voltage generating circuit 10 shown in FIG. 4 is different from that shown in FIG. 2 in the following respects. That is, a PMOS transistor 112 is connected between a supply node of the power supply voltage VDD1 and an output node of the reference voltage VREF. The sense signal EN2 of the logical operation guarantee voltage sensing circuit 40 is supplied to a gate of the PMOS transistor 112.

The logical operation guarantee voltage sensing circuit 40 has: a pair of resistor elements 401, 402 connected in series between the supply node of the power supply voltage VDD1 and a supply node of a ground voltage GND; PMOS transistor 403 and a resistor element 404 connected in series between the supply node of the power supply voltage VDD1 and the supply node of the ground voltage GND. A gate of the PMOS transistor 403 is connected to a serial connection node of the pair of resistor elements 401, 402.

Further, the logical operation guarantee voltage sensing circuit 40 has: a pair of resistor elements 405, 406 connected in series between the supply node of the power supply voltage VDD1 and the supply node of the ground voltage GND; and a resistor element 407 and an NMOS transistor 408 connected in series between the supply node of the power supply voltage VDD1 and the supply node of the ground voltage GND. A gate of the NMOS transistor 408 is connected to a serial connection node of the pair of resistor elements 405, 406.

Then, a signal of a serial connection node between the PMOS transistor 403 and the resistor element 404 and an inversion signal of a signal of a serial connection node between the resistor element 407 and the NMOS transistor 408 are supplied to a NAND gate 409, and a sense signal EN2 is outputted from the NAND gate circuit 409.

In the above configured logical operation guarantee voltage generating circuit 40, when the value of the power supply voltage VDD1 reaches a value that corresponds to a value of the pair of resistor elements 401, 402 and an absolute value of a threshold voltage of the PMOS transistor 403 or a value that corresponds to a value of the pair of resistor elements 405, 406 and a threshold voltage of the NMOS transistor 408, the sense signal EN2 that is an output signal of the NAND gate circuit 409 enters an "H" level. When the sense signal EN2 is at the "H" level, the PMOS transistor 112 is turned OFF. Before the "H" level is reached, the sense signal EN2 enters an "L" level, and the PMOS transistor 112 is turned ON. Then, an output node of the reference voltage VREF is shorted to VDD1.

Figure 5:
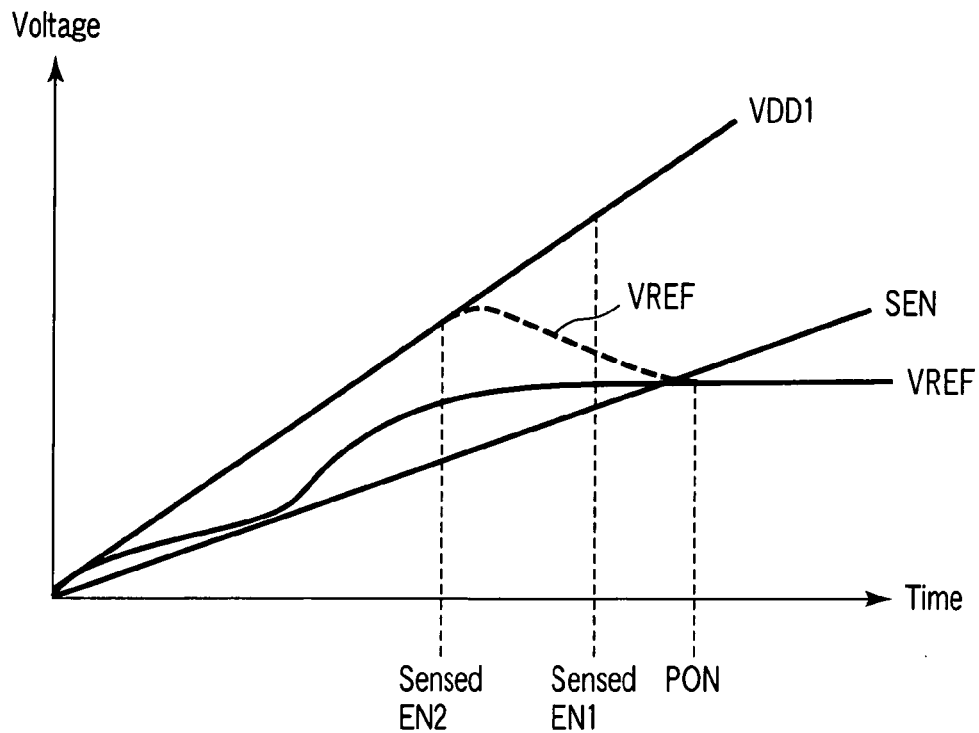
FIG. 5 is a characteristic view showing a voltage change of essential portions when power is turned ON in the semiconductor device according to the first and second embodiments.

FIG. 5 is a characteristic view showing a voltage change of essential portions when power is turned ON in the semiconductor device according to the first and second embodiment. In the figure, a reference voltage VREF indicated by solid line denotes that according to the first embodiment, and a reference voltage VREF indicated by dashed line denotes that according to the second embodiment.

After power has been turned ON, when the value of the power supply voltage VDD1 rises and the value of the reference voltage VREF exceeds a predetermined value, a sense signal EN1 is outputted from a reference voltage level guarantee circuit 20, and a voltage comparator circuit 302 in the power supply voltage sensing circuit 30 starts operation. Then, when a voltage SEN in a resistor dividing circuit 301 incorporated in the power supply voltage sensing circuit 30 reaches the reference voltage VREF, a power ON reset signal PON is activated.

In the case of the second embodiment, the reference voltage VREF rises with a rise of the power supply voltage VDD1 until the sense signal EN2 of the logical operation guarantee voltage sensing circuit 40 is activated. Then, when the sense signal EN2 is activated, and the PMOS transistor 112 is turned OFF, the reference voltage is lowered sequentially. Then, when the voltage SEN in the resistor dividing circuit 301 incorporated in the power supply voltage sensing circuit 30 reaches the reference voltage VREF, the power ON reset signal PON is activated.

The reference voltage VREF is shorted to the power supply voltage VDD1 until the sense signal EN2 is activated. After the sense signal EN2 has been activated, the reference voltage VREF is lowered from the power supply voltage VDD1. Namely, the reference voltage VREF always crosses the voltage SEN. As a result, while the power supply voltage VDD1 is low and the reference voltage VREF is unstable, incorrect sensing can be prevented from being carried out at a voltage equal to or smaller than the sense voltage at a time point at which the reference voltage VREF and the voltage SEN are close to each other. In addition, at a discharge time at which the reference voltage VREF is lowered from the power supply voltage VDD1, a resistance value of each resistor element or the like is set so as to conform to a standard for a power ON reset period. A sense level is prevented from increasing even in the case where a rise of the power supply voltage VDD1 is steep.

Third Embodiment

Figure 6:
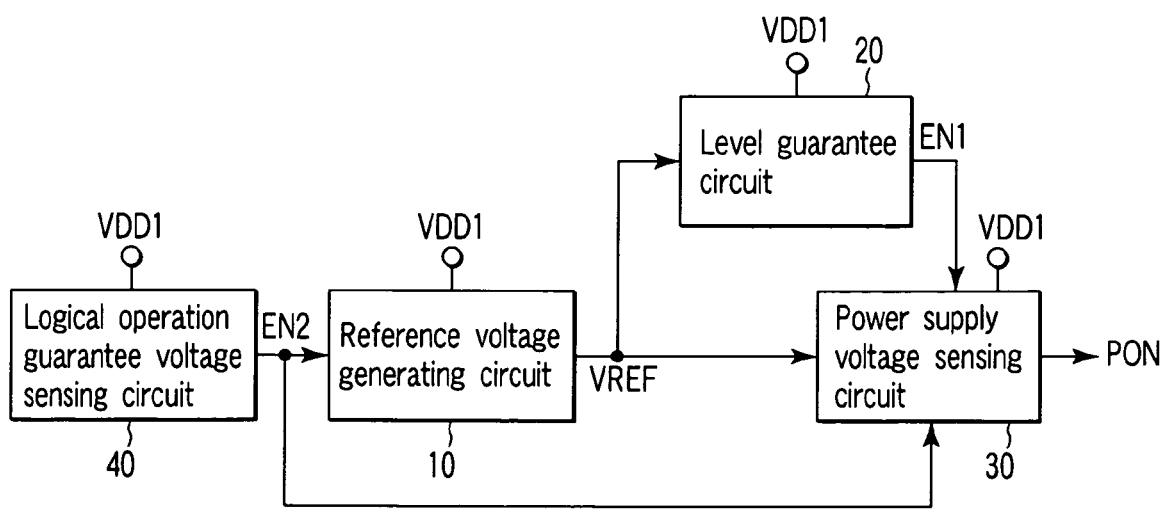
FIG. 6 is a block diagram depicting a semiconductor device according to a third embodiment.

FIG. 6 is a block diagram depicting a semiconductor device according to a third embodiment. In the semiconductor device according to the second embodiment, a description has been given with respect to a case in which the power supply voltage sensing circuit 30 activates and controls the power ON reset signal PON based on only the result of comparison between the reference voltage VREF and the voltage SEN in the resistor dividing circuit 301.

In contrast, a power supply voltage sensing circuit 30 of the semiconductor device according to the third embodiment is configured to activate and control a power ON reset signal PON based on a result of comparison between a reference voltage VREF and a voltage SEN and a sense signal EN2 of a logical operation guarantee voltage sensing circuit 40.

Figure 7:
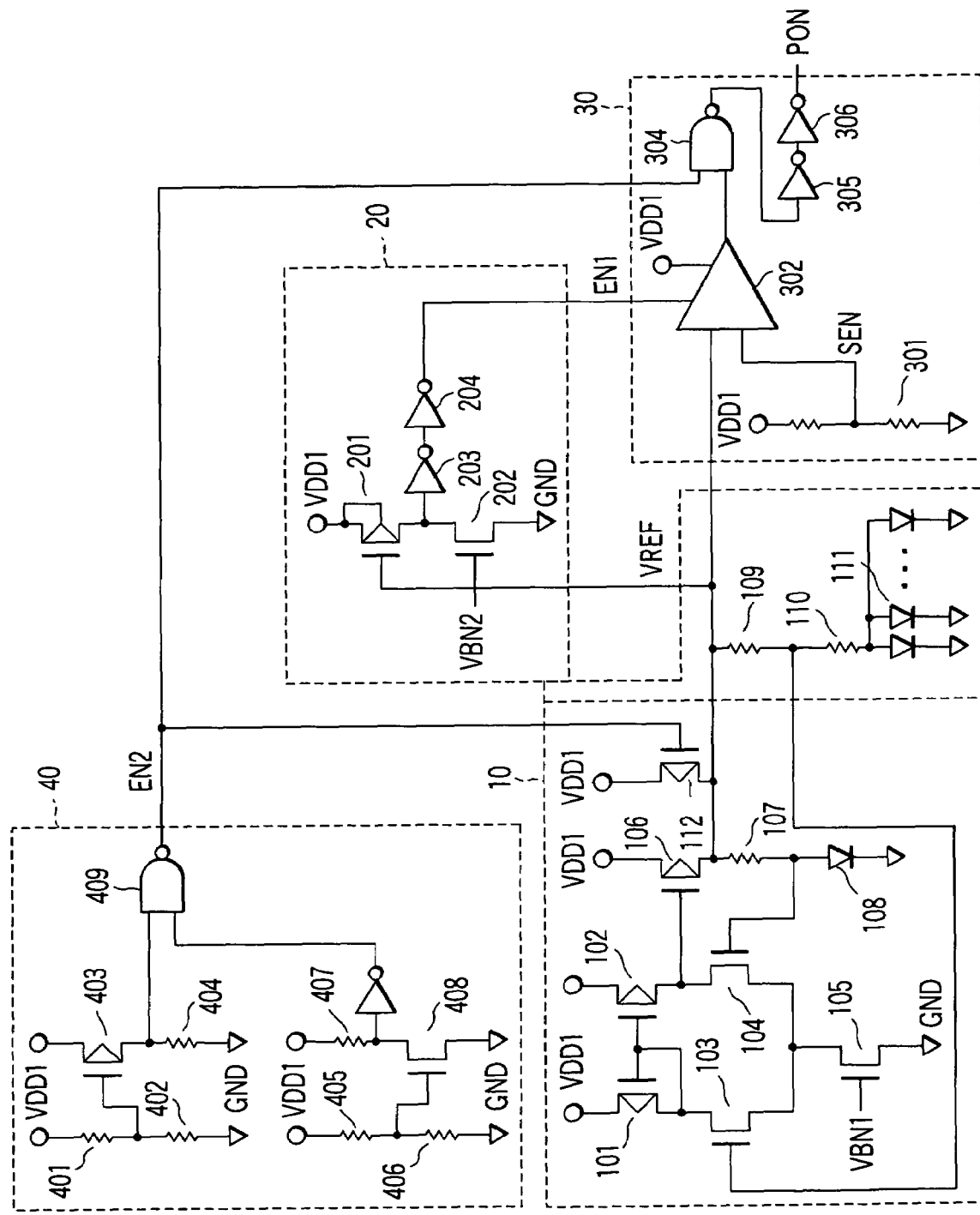
FIG. 7 is a circuit diagram specifically depicting a configuration of each section in the semiconductor device shown in FIG. 6.

FIG. 7 is a circuit diagram specifically depicting a configuration of each section in the semiconductor device shown in FIG. 6. In this case as well, a reference voltage generating circuit 10 is composed of a BGR circuit. In addition, the same constituent elements corresponding to those shown in FIG. 4 are designated by the same reference numerals. Only a difference from FIG. 4 will be described below.

An output signal of the voltage comparator circuit 302 in the power supply voltage sensing circuit 30 is supplied to a NAND gate circuit 304. The sense signal EN2 of the logical operation guarantee voltage sensing circuit 40 is supplied to the NAND gate circuit 304. Output signal of the NAND gate circuit 304 is sequentially inverted by means of two inverter circuits 305, 306, and a power ON reset signal PON is outputted.

In the thus configured semiconductor device, when a value of a power supply voltage VDD1 is low, the sense signal EN2 of the logical operation guarantee voltage sensing circuit 40 enters a "L" level. Then, the output signal of the NAND gate circuit 304 in the power supply voltage sensing circuit 30 is fixed to a "H" level regardless of the output signal of the voltage comparator circuit 302. Therefore, the power ON reset signal PON also enters the "H" level, and the power ON reset signal PON is not activated.

After the value of the power supply voltage VDD1 has risen and the sense signal EN2 of the logical operation guarantee voltage sensing circuit 40 enters the "H" level, the power ON reset signal PON is activated and controlled based on a comparison result of the voltage comparator circuit 302.

That is, in the semiconductor apparatus according to the third embodiment, the power ON reset signal PON is activated and controlled after the sense signal EN2 of the logical operation guarantee voltage sensing circuit 40 has been activated. Thus, there can be further attained an advantageous effect that a malfunction due to noise or the like immediately after power supply can be prevented.

Fourth Embodiment

Figure 8:
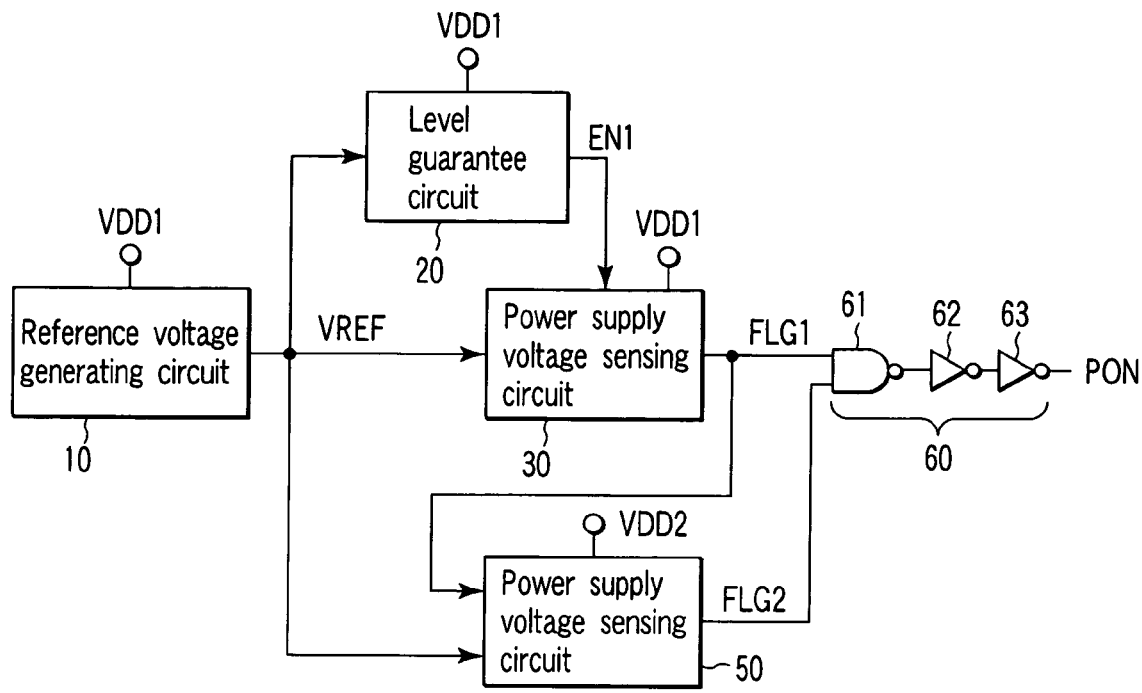
FIG. 8 is a block diagram depicting a semiconductor device according to a fourth embodiment.

FIG. 8 is a block diagram depicting a semiconductor device according to a fourth embodiment. In the semiconductor device according to each of the first, second, and third embodiments, a description has been given with respect to a case in which there exists only one power supply voltage VDD1, and there is provided only one power supply voltage sensing circuit for sensing the power supply voltage VDD1.

In contrast, in the semiconductor device according to the fourth embodiment, there exist a plurality of power supply voltages to be sensed, and there are a plurality of power supply voltage sensing circuits corresponding to these power supply voltages. In the fourth embodiment, there is shown a case in which two power supply voltages VDD1 and VDD2 exist as a plurality of power supply voltages.

The semiconductor device has: a reference voltage generating circuit 10; a reference voltage level guarantee circuit 20; a first power supply voltage sensing circuit 30; a second power supply voltage sensing circuit 50; and a power ON reset signal generating circuit 60.

The reference voltage generating circuit 10 receives a power supply voltage VDD1 and generates from the VDD1 a reference voltage VREF whose value is smaller than VDD1. The reference voltage generating circuit 10 may be composed of a BGR circuit, for example. Otherwise, the generating circuit 10 may be another type of reference voltage generating circuit without being limited to the BGR circuit.

The reference voltage level guarantee circuit 20 senses that a value of the reference voltage VREF generated by the reference voltage generating circuit 10 has reached a predetermined value. A sense signal EN1 of the reference voltage level guarantee circuit 20 is supplied to the first power supply voltage sensing circuit 30.

The first power supply voltage sensing circuit 30 has a voltage comparator circuit whose operation is controlled based on the sense signal EN1. In addition, the voltage comparator circuit compares a divisional voltage with the reference voltage VREF, the divisional voltage having a value proportional to the power supply voltage VDD1, the power supply voltage VDD1 being divided at a predetermined divisional ratio, and outputs a sense signal FLG1. The reference voltage generating circuit 10 and the reference voltage level guarantee circuit 20 can use a similar configuration to that shown in FIG. 2.

The second power supply voltage sensing circuit 50 receives the sense signal FLG1 from the first power supply voltage sensing circuit 30, compares a divisional voltage with the reference voltage VREF by means of a voltage comparator circuit, the divisional voltage having a value proportional to a power supply voltage VDD2, the power supply voltage VDD2 being divided at a predetermined divisional ratio, and outputs a sense signal FLG2.

The sense signals FLG1, FLG2 of the first and second power supply voltage sensing circuits 30, 50 are supplied to a NAND gate circuit 61 in the power ON reset signal generating circuit 60. An output signal of the NAND gate circuit 61 is sequentially inverted by means of two inverter circuits 62, 63, whereby a power ON reset signal PON is outputted.

In the thus configured semiconductor device, after a value of the reference voltage VREF has reached a predetermined value, the power supply voltages VDD1, VDD2 are sensed, respectively, by using the reference voltage VREF by means of the first and second power supply voltage sensing circuits 30, 50, thus making it possible to precisely sense a plurality of power supply voltages.

Figure 9:
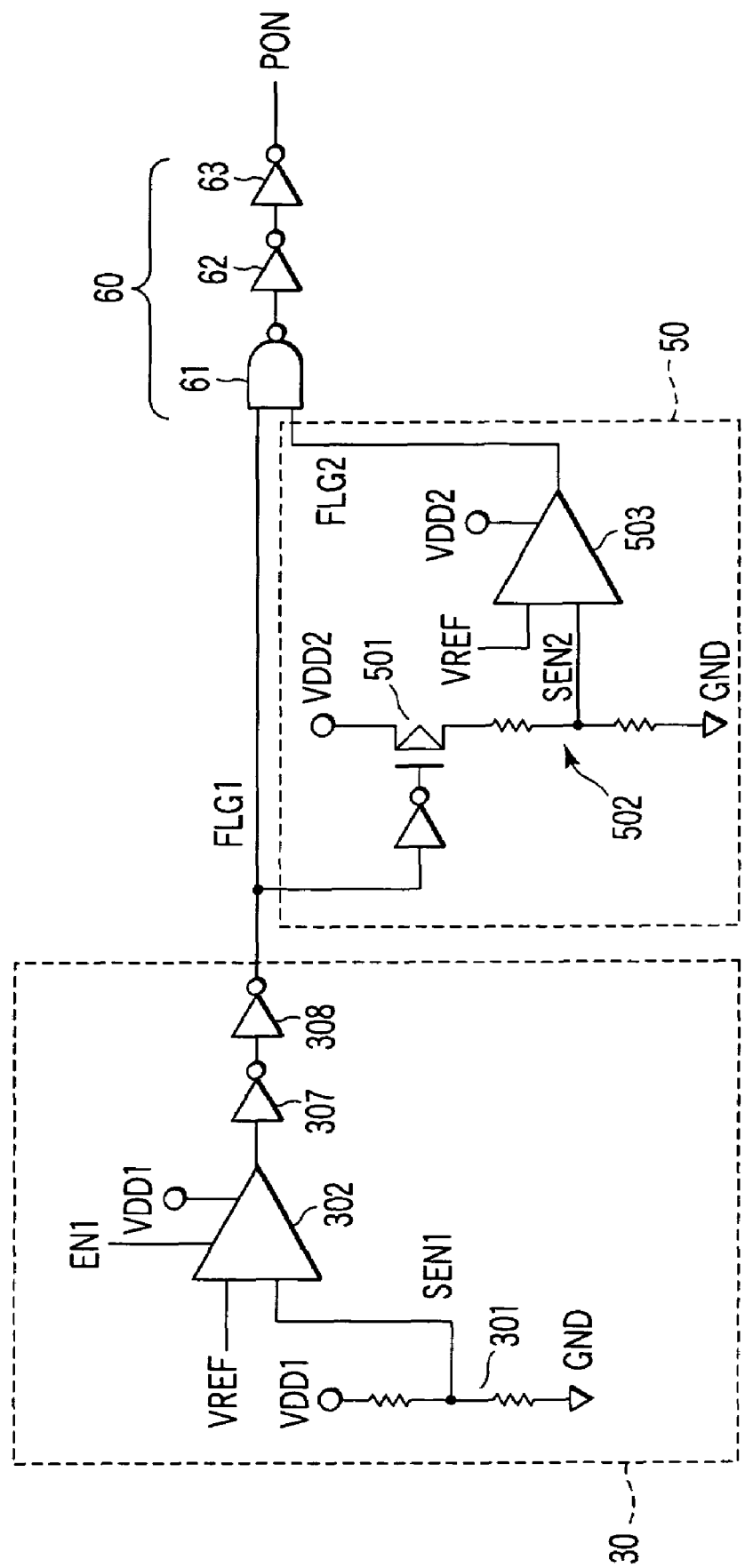
FIG. 9 is a circuit diagram specifically depicting a configuration of a power supply voltage sensing circuit and its peripheral circuits in the semiconductor device shown in FIG. 8.

FIG. 9 is a circuit diagram specifically showing a configuration of the first and second power supply voltage sensing circuits 30, 50 and the power ON reset signal generating circuit 60 in the semiconductor device shown in FIG. 8.

The first power supply voltage sensing circuit 30 shown in FIG. 9 is different from that shown in FIG. 4 in that two inverter circuits 307, 308 are connected in series to an output node of the voltage comparator circuit 302. Other constituent elements are identical to those shown in FIG. 4. The sense signal FLG1 is outputted from the inverter circuit 308 at the later stage of the two inverter circuits 307, 308.

The second power supply voltage sensing circuit 50 has: a PMOS transistor 501 whose source is connected to a supply node of the power supply voltage VDD2, an inversion signal of the sense signal FLG1 being supplied to a gate; a resistor dividing circuit 502 which consists of a pair of resistor elements connected in series between a drain of the PMOS transistor 501 and a supply node of a ground voltage GND, the resistor dividing circuit 502 outputting a voltage SEN2 obtained by dividing the voltage VDD2 at a predetermined divisional ratio α2 (α2<1); and a voltage comparator circuit 503 for comparing the voltage SEN2 with the reference voltage VREF. The sense signal FLG2 is outputted from the voltage comparator circuit 503.

In the circuit shown in FIG. 9, when the sense signal EN1 is activated, the voltage comparator circuit 302 in the first power supply voltage sensing circuit 30 operates. The voltage SEN1 generated by the resistor dividing circuit 301 is compared with the reference voltage VREF, and the power supply voltage VDD1 is sensed. In the first power supply voltage sensing circuit 30, when it is sensed that the power supply voltage VDD1 has reached the reference voltage VREF, the sense signal FLG1 is activated. Then, the PMOS transistor 501 in the second power supply voltage sensing circuit 50 is turned ON, and generation of the voltage SEN2 is started by means of the resistor dividing circuit 502. Then, the voltage SEN2 is compared with the reference voltage VREF by means of the voltage comparator circuit 503 in the second power supply voltage sensing circuit 50, and the power supply voltage VDD2 is sensed.

In this case, when the sense signals FLG1, FLG2 of the first and second power supply voltage sensing circuits 30, 50 are activated together (set to an "H" level), a power ON reset signal PON is activated (set to an "L" level).

Figure 10:
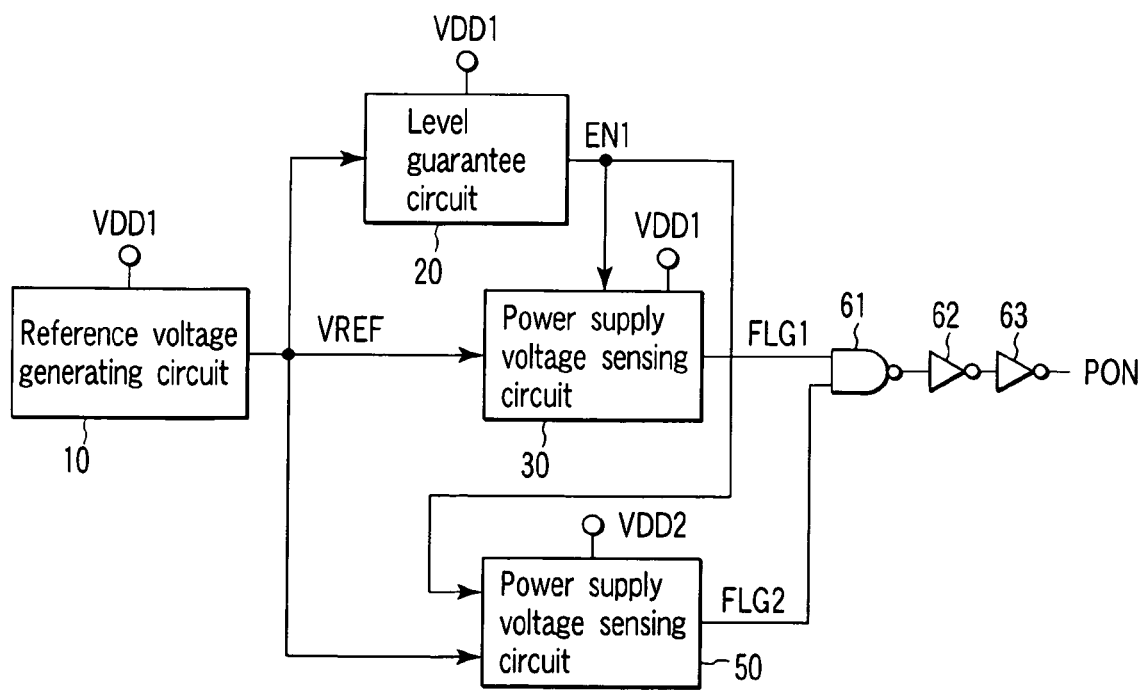
FIG. 10 is a block diagram depicting a semiconductor device according to a modified example of the fourth embodiment.

In the semiconductor device according to the fourth embodiment, a description has been given with respect to a case in which the sense signal FLG1 of the first power supply voltage sensing circuit 30 is supplied to the second power supply voltage sensing circuit 50, and then, ON/OFF operation of the PMOS transistor 501 is controlled by means of this sense signal FLG1. However, as shown in a circuit according to a modified example of FIG. 10, circuit connection may be changed so as to control an operation of the second power supply voltage sensing circuit 50 by means of the sense signal EN1 of the reference voltage level guarantee circuit 20 instead of the sense signal FLG1.

In addition, a circuit whose configuration is equivalent to the second power supply voltage sensing circuit 50 is provided in plurality, and a plurality of circuits whose configuration is equivalent to the second power supply voltage sensing circuit 50 are cascade-connected in a multi-stage manner via each circuit whose configuration is equivalent to the power ON reset signal generating circuit 60 including of the NAND gate circuit 61, and the inverter circuits 62 and 63, whereby a power ON reset signal PON can be activated and controlled based on a result of sensing a number of power supply voltages.

Fifth Embodiment

Figure 11:
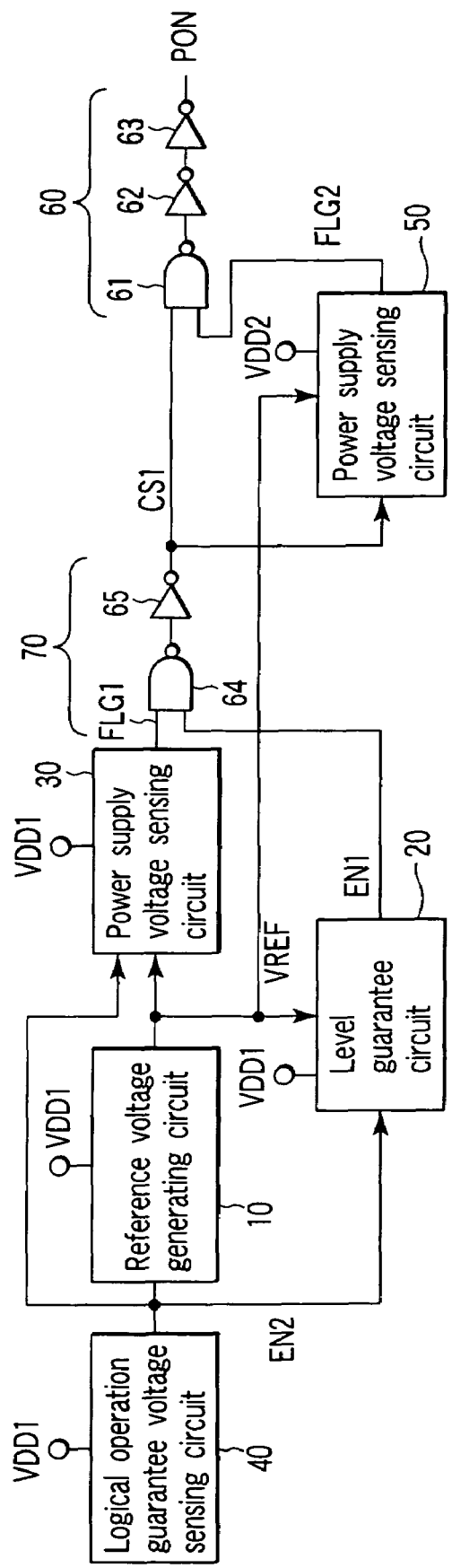
FIG. 11 is a block diagram depicting a semiconductor device according to a fifth embodiment.

FIG. 11 is a block diagram depicting a semiconductor device according to a fifth embodiment. The semiconductor device according to the fifth embodiment is different from that according to the fourth embodiment in that there has been added a circuit having a similar configuration to that of the logical operation guarantee voltage sensing circuit 40 in the semiconductor device according to the third embodiment. In addition, the logical operation guarantee voltage sensing circuit 40 detects that the power supply voltage VDD1 has reached a value such that a normal logical operation of the reference voltage generating circuit 10 can be guaranteed, and an output operation of the reference voltage VREF in the reference voltage generating circuit 10 is controlled based on the sense signal EN2. In this case, the sense signal EN2 of the logical operation guarantee voltage sensing circuit 40 is supplied to the reference voltage level guarantee circuit 20 and the first power supply voltage sensing circuit 30 together with the reference voltage generating circuit 10.

The sense signal FLG1 of the first power supply voltage sensing circuit 30 is supplied to a NAND gate circuit 64 together with the sense signal EN1. An output signal of the NAND gate circuit 64 is supplied to a second power supply voltage sensing circuit 50 and the NAND gate circuit 61 via an inverter circuit 65. A sense signal FLG2 of the second power supply voltage sensing circuit 50 is supplied to the NAND gate circuit 61. The output signal of the NAND gate circuit 61 is sequentially inverted by means of the two inverter circuits 62, 63, whereby the power ON reset signal PON is outputted.

Here, the NAND gate circuit 64 and the inverter circuit 65 configure a signal output circuit 70 for outputting a control signal CS1 from the sense signals EN2 and FLG2. In addition, the NAND gate circuit 61 and the two inverter circuits 62, 63 configure the power ON reset signal output circuit 60 for outputting the power ON reset signal PON from the control signal CS1 and the sense signal FLG2.

The reference voltage generating circuit 10 and the reference voltage level guarantee circuit 20 shown in FIG. 11 can use a similar configuration to that shown in FIG. 2.

FIG. 12 is a circuit diagram specifically depicting a configuration of the first and second power supply voltage sensing circuits 30, 50, the signal output circuit 70, and the power ON reset signal output circuit 60.

The first power supply voltage sensing circuit 30 has: a PMOS transistor 309 whose source is connected to a supply node of a power supply voltage VDD1, an inversion signal of the sense signal EN2 being supplied to a gate; a resistor dividing circuit 301 which consists of a pair of resistor elements connected in series between a drain of the PMOS transistor 309 and a supply node of a ground voltage GND, the resistor dividing circuit 301 outputting a voltage SEN1 obtained by dividing the voltage VDD1 at a predetermined divisional ratio α1 (α1<1); a voltage comparator circuit 302 for comparing the voltage SEN1 with a reference voltage VREF; a NAND gate circuit 310 supplied with an output signal and a sense signal of the voltage comparator circuit 302; and an inverter circuit 311 for inverting an output signal of the NAND gate circuit 310. The sense signal FLG1 is outputted from the inverter circuit 311.

The second power supply voltage sensing circuit 50 has: a PMOS transistor 501 whose source is connected to a supply node of a power supply voltage VDD2, the output signal of an inverter circuit for inverting the control signal CS1 being supplied to a gate; a resistor dividing circuit 502 which includes of a pair of resistor elements connected in series between a drain of the PMOS transistor 501 and a supply node of a ground voltage GND, the resistor dividing circuit 502 outputting a voltage SEN2 obtained by dividing a voltage VDD2 at a predetermined divisional ratio α2 (α2<1); and a voltage comparator circuit 503 for comparing a voltage SEN2 with the reference voltage VREF. The sense signal FLG2 is outputted from the voltage comparator circuit 503.

In the semiconductor device according to the fifth embodiment, after a value of one power supply voltage VDD1 has reached a value such that a normal logical operation of the reference voltage generating circuit 10 can be guaranteed, the reference voltage VREF is outputted from the reference voltage generating circuit 10. Therefore, even in the case where there exist a plurality of power sources (two power sources in the present embodiment), the power supply voltages VDD1, VDD2 are precisely sensed in the first and second power supply voltage sensing circuits 30, 50, and a power ON reset signal PON can be activated and controlled. In the present embodiment, a relationship in magnitude between the power supply voltages VDD1 and VDD2 can be ignored.

Of course, the present invention is not limited to the above described embodiments, and various modifications may be made without departing from the spirit or scope of the general inventive concept as defined by the appended claims and their equivalents. For example, while the present embodiments have described a case in which the reference voltage generating circuit 10 is composed of the BGR circuit, various types of reference voltage generating circuits may be used instead of the BGR circuit. Further, with respect to a specific circuit such as the reference voltage level guarantee circuit 20 and the logical operation guarantee voltage sensing circuit 40, there may be used a circuit having a configuration other than the illustrated configuration.

What is claimed is:

1. A semiconductor device which generates a power ON reset signal, comprising:
    a reference voltage generating circuit which receives a first power supply voltage and generates a reference voltage whose value is smaller than that of the first power supply voltage;
    a reference voltage level guarantee circuit which is connected to the reference voltage generating circuit, and which senses that a value of the reference voltage has reached a first predetermined value and generates a first sense signal;
    a first power supply voltage sensing circuit which is connected to the reference voltage generating circuit and the reference voltage level guarantee circuit, and which includes a first voltage comparator circuit which compares a first voltage having a value that corresponds to the first power supply voltage with the reference voltage, an operation of the comparator circuit being controlled based on the first sense signal, the first power supply voltage sensing circuit outputting a second sense signal based on a comparison result of the first voltage comparator circuit;
    a second power supply voltage sensing circuit which is connected to the reference voltage generating circuit and the first power supply voltage sensing circuit, and which includes a second voltage comparator circuit which compares a second voltage with the reference voltage, the second voltage having a value that corresponds to a second power supply voltage which is different from the first power supply voltage, the second power supply voltage sensing circuit outputting a third sense signal based on a comparison result of the second voltage comparator circuit; and
    a power ON reset signal output circuit which is connected to the first and second power supply voltage sensing circuits, and which outputs a power ON reset signal based on the second sense signal and the third sense signal.

2. The semiconductor device according to claim 1, wherein the reference voltage generating circuit is a band gap reference circuit.

3. The semiconductor device according to claim 1, wherein the reference voltage level guarantee circuit has at least one PMOS transistor, and the first predetermined value is set at a value that corresponds to a threshold voltage of the PMOS transistor.

4. The semiconductor device according to claim 1, wherein the reference voltage level guarantee circuit includes:
    a first PMOS transistor having a source, a drain, and a gate, the source being connected to a supply node of the first power supply voltage, the gate receiving the reference voltage;
    a first NMOS transistor having a source, a drain, and a gate, the drain being connected to the drain of the first PMOS transistor, the source being connected to a supply node of a ground voltage, the gate receiving a first direct current bias voltage; and
    at least one inverter circuit which receives a signal of a drain common connection node of the first PMOS transistor and the first NMOS transistor and outputs the first sense signal.

5. The semiconductor device according to claim 1, wherein the first power supply voltage sensing circuit includes:
    a first resistor dividing circuit which receives the first power supply voltage and divides the first power supply voltage to generate the first voltage; and
    a first voltage comparator circuit which receives the reference voltage, the first voltage, and the first sense signal, an operation of the comparator circuit being controlled based on the first sense signal, and which compares the first voltage with the reference voltage to output the second sense signal,
    the second power supply voltage sensing circuit includes:
    a second resistor dividing circuit which receives the second power supply voltage and divides the second power supply voltage to generate the second voltage; and
    a second voltage comparator circuit which receives the reference voltage and the second voltage and compares the second voltage with the reference voltage to output the third sense signal,
    and the power ON reset signal output circuit includes a NAND gate circuit which receives the second and third sense signals.

6. The semiconductor device according to claim 5, wherein an operation of the second resistor dividing circuit is controlled based on the second sense signal.

7. A semiconductor device which generates a power ON reset signal, comprising:
    a first power supply voltage sensing circuit which receives a first power supply voltage and senses that a value of the first power supply voltage has reached a first determined value to output a first sense signal;
    a reference voltage generator circuit which is connected to the first power supply voltage sensing circuit, an operation of the generator circuit being controlled based on the first sense signal, and which receives the first power supply voltage and generates a reference voltage whose value is smaller than that of the first power supply voltage;
    a reference voltage level guarantee circuit which is connected to the reference voltage generating circuit, and which senses that a value of the reference voltage has reached a second predetermined value to output a second sense signal;
    a second power supply voltage sensing circuit which is connected to the first power supply voltage sensing circuit and the reference voltage generating circuit, and which includes a first voltage comparator circuit which compares a first voltage with the reference voltage, the first voltage having a value that corresponds to the first power supply voltage, an operation of the first voltage comparator circuit being controlled based on the first sense signal, the second power supply voltage sensing circuit outputting a third sense signal based on a comparison result of the first voltage comparator circuit;

a signal output circuit which is connected to the reference voltage level guarantee circuit and the second power supply voltage sensing circuit, and which outputs a control signal from the second sense signal and the third sense signal;

a third power supply voltage sensing circuit which is connected to the reference voltage generating circuit and the first signal output circuit, and which includes a second voltage comparator circuit which compares a second voltage with the reference voltage, the second voltage having a value that corresponds to a second power supply voltage different from the first power supply voltage, an operation of the second voltage comparator circuit being controlled based on the control signal, the third power supply voltage sensing circuit outputting a fourth sense signal based on a comparison result of the second voltage comparator circuit; and a power ON reset output circuit which is connected to the first signal output circuit and the third power supply voltage sensing circuit, and which outputs a power ON reset signal based on the control signal and the fourth sense signal.

8. The semiconductor device according to claim 7, wherein the reference voltage generating circuit is a band gap reference circuit.

9. The semiconductor device according to claim 7, wherein the reference voltage level guarantee circuit has at least one PMOS transistor, and the second predetermined value is set at a value that corresponds to a threshold voltage of the PMOS transistor.

10. The semiconductor device according to claim 7, wherein the reference voltage level guarantee circuit includes:

a first PMOS transistor having a source, a drain, and a gate, the source being connected to a supply node of the first power supply voltage, the gate receiving the reference voltage;

a first NMOS transistor having a source, a drain, and a gate, the drain being connected to the drain of the first PMOS transistor, the source being connected to a supply node of a ground voltage, the gate receiving a first direct current bias voltage; and at least one inverter which receives a signal of a drain common connection node of the first PMOS transistor and the first NMOS transistor and outputs the first sense signal.

11. The semiconductor device according to claim 7, wherein the first power supply voltage sensing circuit includes:

a first resistor dividing circuit which receives the first power supply voltage and dividing the first power supply voltage to generate the first voltage; and a first voltage comparator circuit which receives the reference voltage, the first voltage, and the first sense signal, an operation of the first voltage comparator circuit being controlled based on the first sense signal, and which compares the first voltage with the reference voltage to output the second sense signal, the second power supply voltage sensing circuit includes:

a second resistor dividing circuit which receives the second power supply voltage and divides the second power supply voltage to generate the second voltage; and a second voltage comparator circuit which receives the reference voltage and the second voltage, and which compares the second voltage with the reference voltage to output the third sense signal, and the power ON reset signal output circuit includes a NAND gate circuit which receives the second and third sense signals.

* * * * *